United States Patent [19]

Iyengar

[11] Patent Number: 5,300,824
[45] Date of Patent: Apr. 5, 1994

[54] INTEGRATED CIRCUIT WITH IMPROVED ON-CHIP POWER SUPPLY CONTROL

[75] Inventor: Narasimhan Iyengar, Plano, Tex.

[73] Assignee: Texas Instruments Incorporated, Dallas, Tex.

[21] Appl. No.: 24,924

[22] Filed: Feb. 26, 1993

Related U.S. Application Data

[63] Continuation of Ser. No. 919,076, Jul. 23, 1992, abandoned, which is a continuation of Ser. No. 745,775, Aug. 16, 1991, abandoned, which is a continuation of Ser. No. 515,977, Apr. 27, 1990, Pat. No. 5,063,304.

[51] Int. Cl.$^5$ .............................................. H03K 17/16
[52] U.S. Cl. ................................ 307/296.3; 307/296.6; 365/228
[58] Field of Search ........................... 307/296.2–296.3, 307/296.6–296.8, 270, 304; 365/220–221, 228–229, 238

[56] References Cited

U.S. PATENT DOCUMENTS

| | | | |
|---|---|---|---|
| 4,815,041 | 3/1989 | Baylock | 365/229 X |
| 5,046,052 | 9/1991 | Miyaji et al. | 365/229 X |
| 5,063,304 | 11/1991 | Iyengar | 307/296.8 X |

FOREIGN PATENT DOCUMENTS

0399240A2 11/1990 European Pat. Off. .
2813402A1 10/1979 Fed. Rep. of Germany .

*Primary Examiner*—David R. Hudspeth
*Attorney, Agent, or Firm*—Lawrence J. Bassuk; Robby T. Holland; Richard L. Donaldson

[57] ABSTRACT

An on-chip power supply regulation system for a VLSI circuit such as a dynamic RAM is disclosed. The system includes a high power supply voltage detection circuit and a power supply clamp circuit, where a clamped voltage generated by the clamp circuit biases the functional circuitry when the high power supply voltage detection circuit detects an overvoltage condition. The bias voltage applied to the functional circuitry in the normal operating condition can be a regulated voltage generated from the power supply voltage. Further included in the disclosed circuit is a burn-in voltage generation circuit and a burn-in voltage detection circuit, which can apply an accelerated voltage which depends upon the applied power supply voltage, when the power supply voltage is higher than during normal operation but lower than in the overvoltage condition enabling the clamp operation. A multiplexer connects the regulated voltage, the clamped voltage, or the accelerated voltage, to the circuit depending upon the level of the external power supply voltage. In this way, the offset between the accelerated voltage and the external power supply voltage can be optimized independently from the power supply voltage at which the accelerated voltage is enabled.

7 Claims, 8 Drawing Sheets

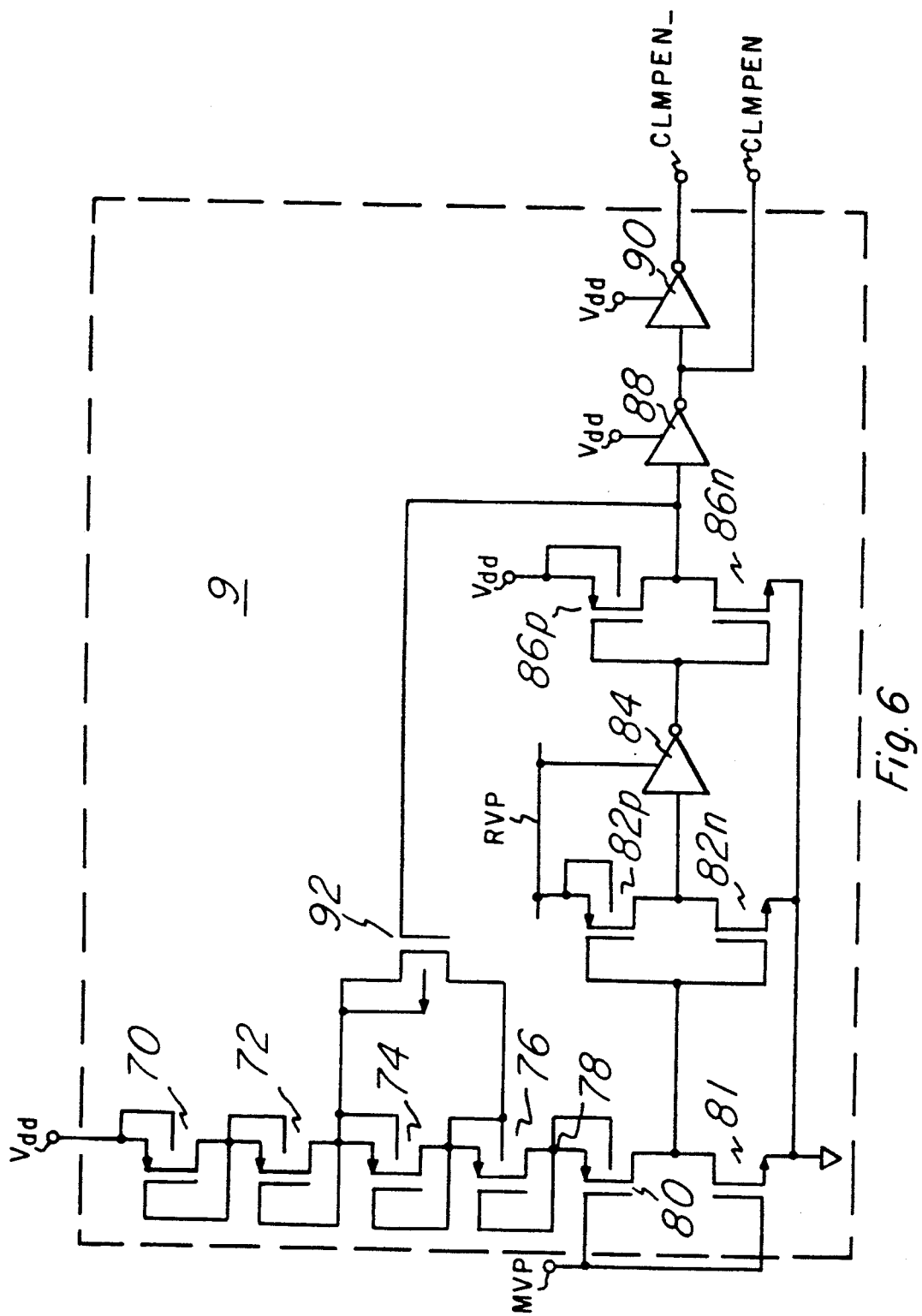

INTEGRATED CIRCUIT WITH IMPROVED ON-CHIP POWER SUPPLY CONTROL

This application is a continuation of application Ser. No. 07/919,076, filed Jul. 23, 1992 abandoned; which is a continuation of application Ser. No. 07/745,775, filed Aug. 16, 1991 abandoned; which is a continuation of application Ser. No. 07/515,977, filed Apr. 27, 1990, now U.S. Pat. No. 5,063,304.

This invention is in the field of integrated circuits and is more specifically directed to on-chip power supply control.

BACKGROUND OF THE INVENTION

In recent years, the density of components are integrated into single integrated circuit devices has increased at a high rate. Examples of such high density circuits include dynamic random access memories (dRAMs), which are now being fabricated at 4 Mbit and 16 Mbit single-chip densities. In order to accomplish such complexities while maintaining the size of the chip at reasonable and manufacturable levels, the minimum feature size of the transistors and other components must of course be reduced. For dRAM devices, which have generally been the most densely integrated devices in the industry, the size of features such as MOS transistor gates is generally at the smallest size manufacturable by available technology. In the example of 16 Mbit dRAM devices, transistor gate widths are expected to be in the range of 0.5 to 0.7 microns.

It is well known that MOS transistors which have gate widths, and accordingly transistor channel lengths, which are of sub-micron dimensions are subject to time and voltage dependent phenomena to which larger transistors are not subject. An example of such a phenomenon is transistor performance degradation due to channel hot-carrier effects. While certain techniques are available to reduce the susceptibility of transistors to channel hot-carrier effects, such as providing graded junctions as described in U.S. Pat. No. 4,356,623 issued Nov. 2, 1982, and assigned to Texas Instruments Incorporated, the drain-to-source voltage nominally applied to the transistor structure remains a strong factor in the channel hot-carrier degradation of the transistor performance.

Furthermore, the storage element in dRAMs is commonly a thin film capacitor. It is well known that the data stored in dRAM capacitors may be upset by naturally occurring alpha particles. The degree to which data is lost in such events depends upon the capacitance of the memory cell, and accordingly the capacitance of modern dRAM cells is generally maintained above 35 fF for each cell, and preferably above 50 fF. Since it is desirable that the density of storage cells per unit area should be as large as possible, in order to maintain the necessary storage capacitance of 35 to 50 fF, the thickness of the capacitor dielectric must be reduced. Modern storage capacitors thus have dielectric thicknesses on the order of the equivalent of 10 nm of silicon dioxide, or less. However, with such thin capacitor dielectrics, both dielectric breakdown voltage and time-dependent dielectric breakdown rates degrade with thinner dielectrics, assuming a constant voltage applied thereacross.

For these reasons, the power supply voltages applied to such high density VLSI devices including dRAMs, other memories, and logic devices, are preferably reduced as the feature sizes decrease. In addition, since the power dissipation of the chip increases with increasing numbers of components integrated into the chip, a reduced power supply voltage would also reduce the device power dissipation. Many other circuits may still use a higher power supply voltages (e.g., 5 volts nominally) than is desired by the high density components described above (e.g., 3.3 volts), which makes the designer of systems incorporating these devices reluctant to provide an additional power supply in the system, due to the cost of such other supplies and the routing of an additional bias voltage.

It should also be noted that it is desirable that the performance of the integrated circuit should not vary strongly with the power supply voltage applied thereto, as such variation may increase the cost of production testing of the chip during its manufacture, but such variation may also cause system-level problems for the user.

Furthermore, in the field of dRAM devices, due to the large amount of thin capacitor dielectric on each device, manufacturers generally perform a "burn-in" operation during the test process of the chips. Burn-in is intended to stress the devices both by voltage and by temperature so that weak devices are removed from the population which is shipped to the user of the devices (i.e., removing the "infant mortality" portion of the reliability curve). On-chip regulation of the bias voltage for the memory array, for example, will preclude the direct application of the power supply voltage to the capacitors, however.

Referring first to FIG. 1, a power supply regulation system according to the prior art will be described in detail. The system of FIG. 1 provides a regulated voltage to memory array 125 when the circuit is biased at nominal $V_{dd}$ power supply voltages (e.g., from 4.5 volts to 6.0 volts) and provides a stress voltage to array 125 when a higher $V_{dd}$ level (e.g., above 6.0 volts) is applied, for example during such a burn-in operation. Reference voltage generator circuit 121, according to conventional designs such as a bandgap reference circuit and a voltage multiplier circuit, provides a regulated voltage on line MVA' to one input of comparator driver 122 and to stress, or burn-in, voltage generator circuit 115. The voltage on line MVA' is preferably at a voltage which is less than the nominal $V_{dd}$ power supply level during normal operation. For example, the voltage on line MVA' can be on the order of 3.3 volts.

Comparator driver 122 is of conventional design, and receives at its other input line VBIN' from burn-in voltage generator circuit 115. Comparator driver 122 in the system of FIG. 1 according to the prior art is constructed conventionally in such a fashion that array 125 is biased by the voltage which is the greater of the voltage on line MVA' and the voltage on line VBIN'.

Burn-in voltage generator circuit 115 according to the prior art system of FIG. 1 includes a differential amplifier 155 constructed according to a conventional design, including for example an n-channel MOS differential amplifier with a p-channel current mirror active load. Differential amplifier 155 is biased by an n-channel current source, which in turn is biased by a low voltage on line VREF, generated by reference voltage generator circuit 121. The second input to differential amplifier 155 is a voltage which is substantially three p-channel threshold voltages (i.e., $3V_{tp}$) below $V_{dd}$, due to the series connection of p-channel transistors 150 between $V_{dd}$ and the second input to differential amplifier 155.

Accordingly, the output of differential amplifier 155 on line VBIN' is at a high voltage when the value of $V_{dd}$ less $3V_{tp}$ is greater than the voltage on line MVA' from reference voltage generator circuit 121.

The operation of the prior art system of FIG. 1 is illustrated by the dotted line portion of the transfer characteristic of FIG. 9. When the external power supply voltage $V_{dd}$ is above a certain level for operation, but below a value of approximately 6.3 volts, in this example, the bias of array 125 is at the voltage of line MVA', which in this case is on the order of 3.3 volts, as generated by reference voltage generator circuit 121. However, when $V_{dd}$ exceeds the voltage on line MVA' by $3V_{tp}$ ($V_{tp}$ in this example being on the order of 1.0 volts), differential amplifier 155 will drive line VBIN' to the higher voltage of $V_{dd}$ less $3V_{tp}$. Comparator driver 122 will, in turn, present this higher voltage to array 125. As the external power supply voltage $V_{dd}$ continues to rise, the voltage applied to array 125 also rises, following the transfer characteristic shown by the dotted line in FIG. 9. In this way, the system of FIG. 1 according to the prior art can apply a stress voltage to array 125 which varies with $V_{dd}$, so that a burn-in or other stress operation can be performed.

The system of FIG. 1 has limitations in its flexibility of operation, however. If, for example, a certain high stress voltage were desired to be applied to array 125, for example, a stress voltage on the order of 7.0 volts, according to the above-described example, an external $V_{dd}$ voltage of 10.0 volts is necessary. However, modern sub-micron transistors may not be capable of withstanding the stress of a 10.0 volt bias, and while the array in the system of FIG. 1 would not receive such a high voltage due to the operation of the system, there would be transistors in the periphery of the device (e.g., those transistors in reference voltage generator 121 and in burn-in voltage generator circuit 115) which are biased directly by $V_{dd}$. Limitations on the voltage applied to these transistors could thus limit the maximum stress voltage which the system of FIG. 1 could apply to array 125.

In order to apply such a high stress voltage to array 125 according to the system of FIG. 1 without damaging peripheral transistors, the designer of the system could reduce the number of transistors 150 in burn-in voltage generator circuit 115, so that the difference between $V_{dd}$ and the voltage of line VBIN' during stress conditions would be reduced. By reducing the number of transistors 150 in burn-in voltage generator circuit to two, for example, a 7.0 volt stress bias could be applied to array 125 with only 9.0 volts applied to $V_{dd}$. However, if the number of transistors 150 in the system of FIG. 1 were reduced to two, the system would apply the stress voltage at a lower level of $V_{dd}$, in this case when $V_{dd}$ was $2V_{tp}$ over the voltage on line MVA'. With a $V_{tp}$ on the order of 1.0 volts and the voltage on line MVA' at 3.3 volts in this example, the stress condition would be applied to array 125 when $V_{dd}$ exceeded 5.3 volts. Since a $V_{dd}$ of 5.3 volts is within the specified normal operating range of $V_{dd}$ for conventional dRAM devices, though, such a construction of burn-in voltage generator circuit 115 would result in stress of array 125 during normal operation.

It should therefore be evident that the system of FIG. 1 provides quite limited flexibility to the designer of the circuit using such a power regulation system, especially in selecting a stress voltage.

In addition, VLSI devices including small feature sizes as described above also may be damaged by overvoltage conditions which are inadvertently applied to the device by the user, or during test operations. Furthermore, since complementary MOS (i.e., CMOS) technology is now commonly used in VLSI circuits due to its reduced power dissipation and fast performance, latchup of CMOS structures at excessive power supply voltages, due to the parasitic thyristors inherent in CMOS, is also a concern.

It is therefore an object of this invention to provide an on-chip system for regulating the power supply voltage applied to various portions of a large scale integrated circuit.

It is therefore another object of this invention to provide such an on-chip system for regulating its internal bias voltages so that the performance of the chip is relatively stable with respect to the power supply voltage.

It is therefore another object of this invention to provide such a system which can apply a stress voltage to portions of the device, responsive to the power supply voltage applied externally to the device.

It is therefore another object of this invention to provide such a system which allows the stress voltage to be determined independently from the regulated internal bias voltage.

It is therefore another object of this invention to provide such a system which clamps internal bias voltages responsive to an excessive externally applied power supply voltage.

Other objects and advantages of this invention will be apparent to those of ordinary skill in the art having reference to the following specification, together with the drawings.

SUMMARY OF THE INVENTION

The invention may be incorporated into a power distribution system on an integrated circuit. A detection circuit is provided which detects an overvoltage condition and generates a signal indicating this condition. A multiplexer is controlled by this signal in such a manner that a clamped voltage is applied to the functional portion of the integrated circuit, so that excessive voltage does not reach the functional circuitry. The invention may further include the generation of a stress voltage which varies with the externally applied power supply value, so that an accelerated voltage may be applied to the circuit. A detection circuit for the stress voltage presents a signal so that the varying stress voltage is applied when the external power supply voltage is above a certain value, but below the clamping value. A regulated power supply voltage may be generated on chip, so that the performance of the circuit is stable with respect to the external power supply voltage below the stress voltage level.

BRIEF DESCRIPTION OF THE DRAWINGS

FIG. 6 is an electrical diagram, in schematic form, of an embodiment of an overvoltage detection circuit in the system of FIG. 2.

DETAILED DESCRIPTION OF THE PREFERRED EMBODIMENT

Figure 2:
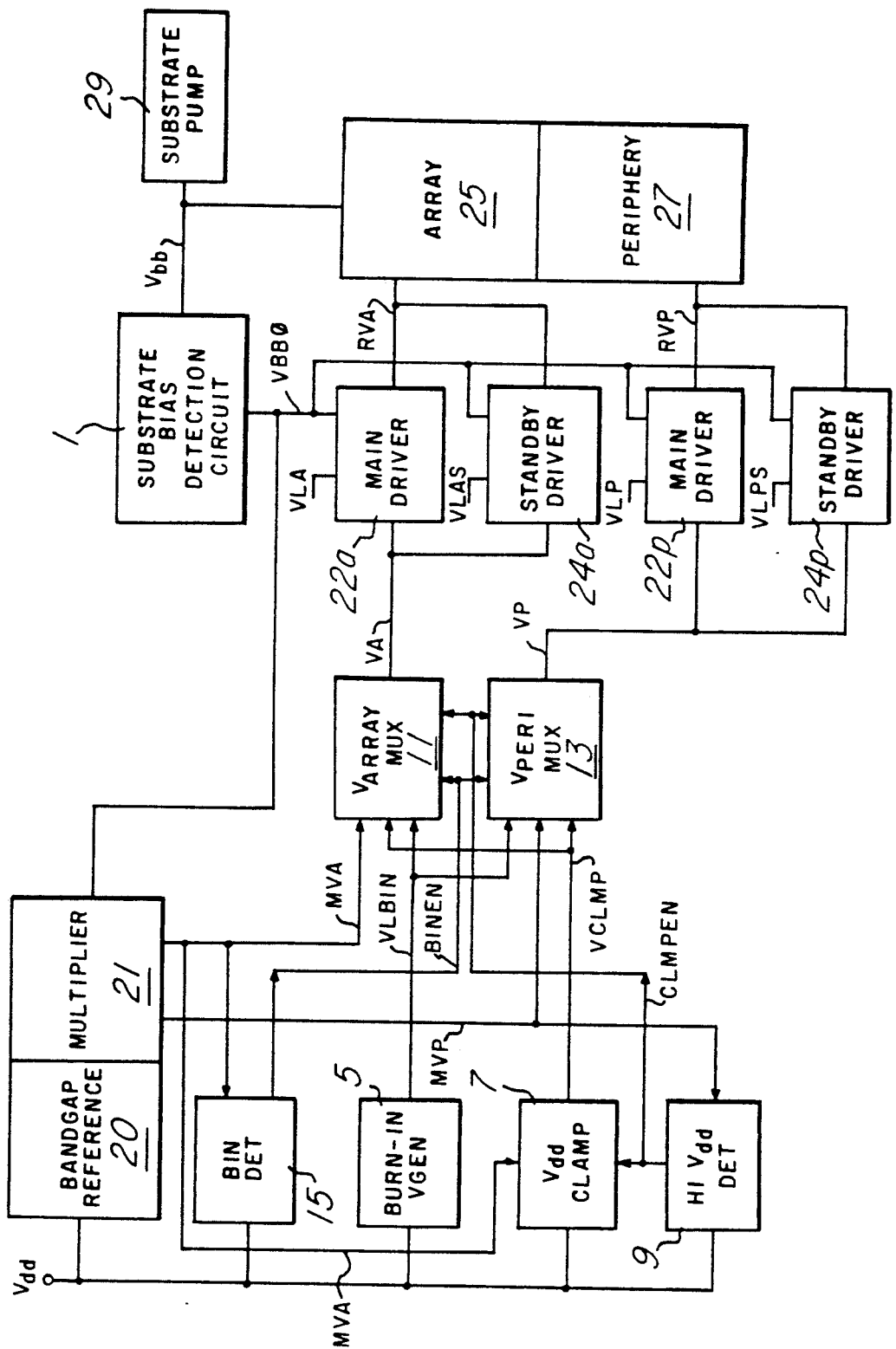
FIG. 2 is an electrical diagram, in block form, of the power supply distribution system in the preferred embodiment of the invention.

Referring now to FIG. 2, a preferred embodiment of the power supply regulation system in an integrated circuit according to this invention will now be described. It should be noted that this embodiment of the invention is preferably included in the same integrated circuit chip as the functional chip to be controlled thereby. The example of an integrated circuit chip using the system of FIG. 2 is a dynamic random access memory (dRAM) having a memory array 25 and peripheral circuitry 27. It will of course be apparent that the power supply regulation system described herein will be equivalently applicable to other integrated circuit types, including other types of memories and VLSI logic circuits.

In this embodiment, different bias voltages are used for array 25 (including some circuitry associated therewith, such as sense amplifiers, hereinafter collectively referred to as array 25) and for periphery 27. It may be desirable, as in this case, that a bias voltage which is below the externally applied voltage $V_{dd}$ bias array 25, so that the power dissipation by the array and also the time-dependent dielectric breakdown of the capacitor dielectric in the dRAM array 25 is reduced. In this example, since the performance of peripheral circuitry 27 directly affects the performance of the memory device, it may be preferable to bias periphery 27 with a voltage which is higher than that used to bias array 25. Accordingly, in the system of FIG. 2, memory array 25 is biased by the voltage on line RVA, and the peripheral circuitry is biased by the voltage on line RVP. It should of course be noted that the present invention may equivalently apply to integrated circuits having the whole of the functional circuitry (e.g., in the case of a memory device, both array 25 and periphery 27) biased at the same voltage. However, due to the benefits of both reduced power dissipation through array 25 and the improved performance of higher bias for periphery 27, this embodiment provides for different bias thereto.

Bandgap reference circuit 20 and multiplier circuit 21 generate voltages on lines MVA and MVP, respectively, for biasing array 25 and periphery 27, respectively, during normal operation. Many such bandgap voltage reference generator circuits are well known in the art, and accordingly bandgap circuit 20 will not be further described herein. The output of bandgap reference circuit 20 is a reference voltage $V_{REF}$ (not shown in FIG. 2) which is presented to voltage multiplier circuit 21. Voltage multiplier circuit 21 may be constructed according to one of many conventional configurations, and generates, in this example, two output voltages from the voltage $V_{REF}$, one on line MVA and the other on line MVP. For example, the voltage on line MVA may be on the order of 3.3 volts, while the voltage on line MVP may be on the order of 4.0 volts.

Burn-in voltage generator circuit 5 generates a voltage on line VLBIN which varies with the externally applied power supply voltage $V_{dd}$. $V_{dd}$ clamp circuit 7 provides, on line VCLMP, a voltage which is clamped to a fixed level once the external voltage $V_{dd}$ exceeds a certain value, as detected by high $V_{dd}$ detection circuit 9. Line MVA, together with lines VLBIN and VCLMP are connected to inputs of $V_{array}$ multiplexer 11. Similarly, line MVP, together with lines VLBIN and VCLMP, are connected to inputs of $V_{peri}$ multiplexer 13.

$V_{array}$ multiplexer 11 applies at its output, on line VA, the voltage from one of lines MVA, VLBIN, and VCLMP, responsive to control signals on line BINEN from burn-in voltage detection circuit 15, and on line CLMPEN from high $V_{dd}$ detection circuit 9. Similarly, $V_{peri}$ multiplexer 13 applies the voltage on line VP from one of lines MVP, VLBIN, and VCLMP, depending upon the signals on lines BINEN and CLMPEN.

The voltage on lines VA and VP are each connected to two drivers 22 and 24. It should be noted that, depending upon the distances involved, it may be preferable to provide unity-gain buffers between multiplexers 11 and 13, and drivers 22 and 24. A preferred example of such a unity-gain buffer is described in copending application Ser. No. 493,085 filed Mar. 12, 1990, assigned to Texas Instruments Incorporated and incorporated herein by this reference. Main drivers $22_A$ and $22_P$ are provided to bias array 25 and periphery 27, respectively, during active operation, while standby drivers $24_A$ and $24_P$ are provided to bias array 25 and periphery 27, respectively, when the circuit is in a standby condition. A substrate pump 29 is also provided for biasing the substrate of array 25 and periphery 27 with a backgate bias $V_{bb}$. Substrate pump 29 may be constructed according to one of many conventional configurations for generating a bias voltage below $V_{ss}$, or ground. Examples of conventional substrate pumps are described in U.S. Pat. No. 4,585,954, issued Apr. 29, 1986, U.S. Pat. No. 4,628,215, issued Dec. 9, 1986, and in U.S. Pat. No. 4,631,421, issued Dec. 23, 1986, all assigned to Texas Instruments Incorporated and incorporated herein by this reference. In the alternative, $V_{bb}$ may be provided to an external terminal of the integrated circuit.

The $V_{bb}$ voltage is also connected to a substrate bias detection circuit 1 as well, so that its voltage can be detected. A preferred example of substrate bias detection circuit 1 is described in my copending application Ser. No. 475,061, filed Feb. 5, 1990, assigned to Texas Instruments Incorporated and incorporated herein by this reference. In this preferred embodiment of the invention, drivers 22 and 24 are responsive to substrate bias detection circuit 1 so that array 25 and periphery 27 are powered down in the event of loss of substrate bias. This powering-down of array 25 and periphery 27 protects those portions of the integrated circuit from damage due to latchup of the parasitic SCR inherent in CMOS structures. Of course, for purposes of the present invention, the powering down of the circuit responsive to loss of substrate bias, and accordingly the provision of substrate bias detection circuit 1, is merely optional.

Besides receiving the voltage on its associated one of lines $V_A$ and $V_P$, each of drivers 22 and 24 also receive a signal on line VBB0_ from detection circuit 1. In this example, as described above, line VBB0_ will have a low logic level in the event that the substrate bias $V_{bb}$ is insufficient, as measured against $V_{ss}$. Each of drivers 22 and 24 are biased by $V_{dd}$ (not shown), which is externally presented to the chip, as well as by the voltages $V_A$ and $V_P$ generated by multiplier circuit 22. Lines $V_{LA}$, $V_{LAS}$, $V_{LP}$, and $V_{LPS}$ are received by drivers $22_A$, $24_A$, $22_P$ and $24_P$, respectively, and serve as enable signals thereto. Main drivers $22_A$ and $22_P$ are enabled and disabled by signals on lines $V_{LA}$ and $V_{LP}$, respectively, so that they bias their respective portions of the circuit only during active operations, and are disabled during such time as the device is in a standby state. In the example of a conventional dRAM device, enabling signals on lines $V_{LA}$ and $V_{LP}$ can be generated from the row address strobe (RAS_) signal, so that main drivers 22 are active only during the active portions of memory cycles.

Standby drivers $24_A$ and $24_P$ are preferably similarly constructed as main drivers $22_A$ and $22_P$, only with smaller transistors so that the current drawn therethrough, and the power dissipated thereby, is reduced during such standby times. It should be noted that lines $V_{LAS}$ and $V_{LPS}$ can allow the enabling and disabling of standby drivers $24_A$ and $24_P$, respectively, so that they can be disabled during such time as main drivers $22_A$ and $22_P$ are active. However, due to the low current draw of standby drivers 24, it is preferable to keep standby drivers 24 enabled during all cycles (both active and standby), so that the control logic is minimized.

Figure 3:
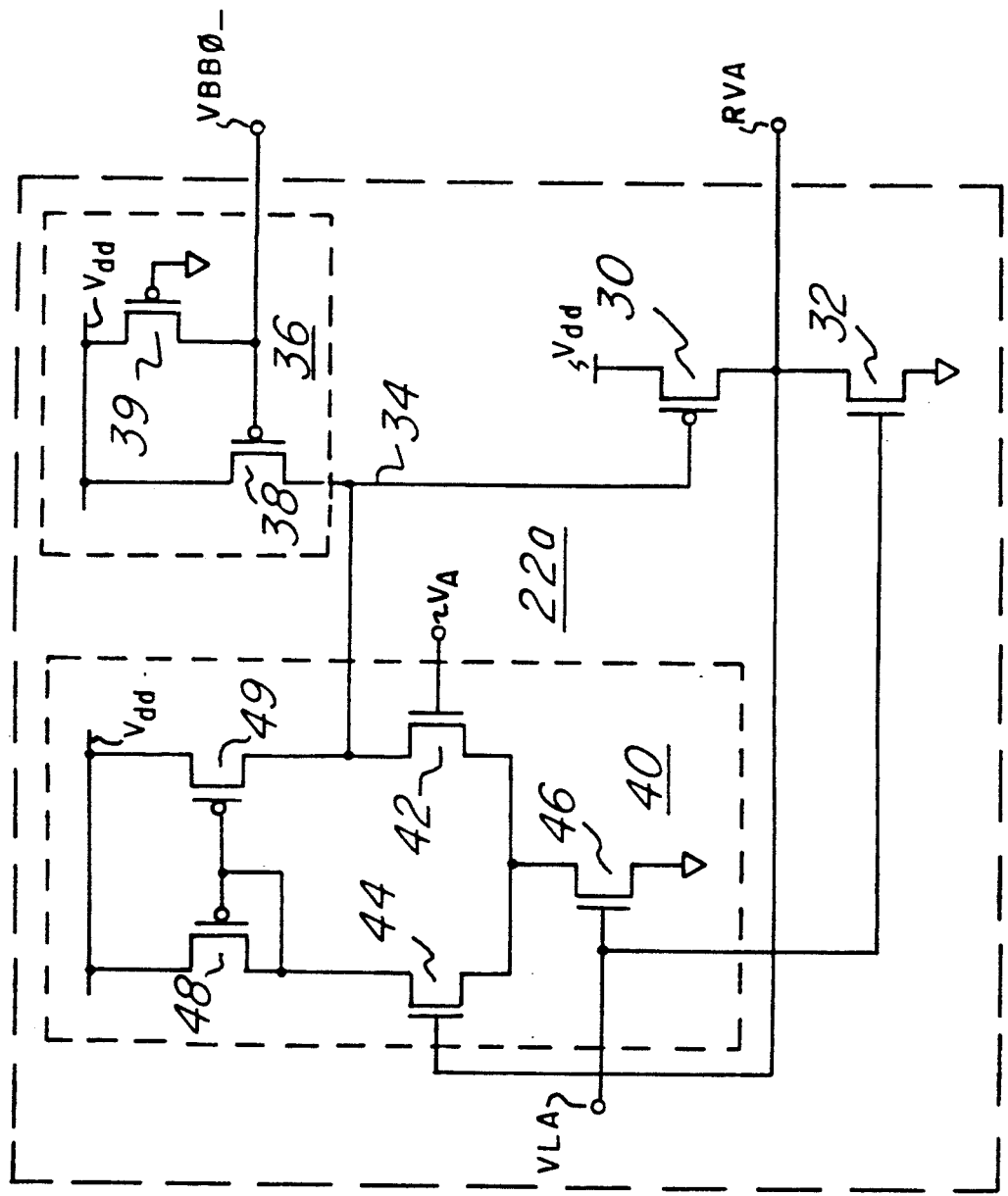
FIG. 3 is an electrical diagram, in schematic form, of a driver in the circuit of FIG. 2.

Referring now to FIG. 3, the construction of driver 22A will be described in detail. It should be noted that each of drivers 22 and 24, whether associated with array 25 or periphery 27, can be constructed according to the circuit of FIG. 3, or of course according to other conventional designs for voltage driver circuits. The circuit of FIG. 3 is particularly adapted for having its output disabled in the event of loss of substrate bias, communicated thereto by way of line VBB0_ from substrate bias detection circuit 1.

As shown in FIG. 3, driver 22A receives the externally provided $V_{dd}$ supply, a voltage on line $V_A$, and signals on lines $V_{LA}$ and VBB0_. Line RVA is the output of driver 22A, and is driven by the drains of p-channel transistor 30 and n-channel transistor 32 connected in push-pull fashion. The source of p-channel transistor 30 is biased by $V_{dd}$, and its gate is connected to node 34; the source of n-channel transistor 32 is at ground, and its gate is controlled by line $V_{LA}$. Since the discharging of line RVA through transistor 32 can occur quite slowly, the size of transistor 32 can be quite small relative to transistor 30. It should be noted that n-channel transistor 32 is preferably much smaller than p-channel transistor 30, so that with both transistors in the on-state, the power dissipation therethrough will be minimized. For example, the W/L ratio of transistor 32 can be on the order of 0.01, while the W/L ratio of transistor 30 can be on the order of 50 to 100.

Comparator 40 drives node 34 with a voltage depending upon the level of line $V_A$ relative to the level of line RVA driven by main driver $22_A$. Comparator 40 is configured according to conventional techniques, with the n-channel MOS differential amplifier of transistors 42 and 44 having a current mirror active load of transistors 48 and 49. Line $V_A$ is connected to comparator 40 via its connection to the gate of n-channel transistor 42, to provide a reference voltage to comparator 40. N-channel transistor 44 has its gate connected to line RVA, to provide feedback to comparator 40. Line $V_{LA}$ is connected to the gate of n-channel transistor 46, which has its drain connected to the sources of transistors 42 and 44, and has its source connected to ground. P-channel transistor 48 has its source biased at $V_{dd}$, and has its drain connected to the drain of transistor 44. Similarly, p-channel transistor 49 has its source biased at $V_{dd}$ and has its drain connected to the drain of transistor 42. The gates of transistors 48 and 49 are connected to the drains of transistors 48 and 44. The drains of transistors 49 and 42 are connected to node 34, which controls the gate of p-channel pull-up transistor 30.

In comparator 40, the sizes (i.e., W/L ratios) of certain transistor pairs are preferably well matched so that the voltages $V_A$ and $V_P$ presented by voltage multiplier 22 are indeed the voltages applied to the array, sense amplifiers, and periphery by the drivers 22 and 24. In comparator 40 of FIG. 3, the W/L ratios of transistors 42 and 44 are preferably matched to one another (for example, with W/L on the order of 10), and the ratios of transistors 48 and 49 are preferably well matched (for example, with W/L on the order of 15 to 20).

Also included in main driver $22_A$, according to this embodiment of the invention, is disable circuit 36, which also controls node 34. Disable circuit 36 includes a p-channel transistor 38, with its source biased by $V_{dd}$ and its drain connected to node 34. Line VBB0_ is connected to the gate of p-channel transistor 38. P-channel transistor 39 has its source-to-drain path connected between $V_{dd}$ and the gate of transistor 38, and has its gate biased to ground. This actively pulls up the gate of transistor 38, holding transistor 38 in the off state in the event that line VBB0_ for some reason floats. Transistor 39 is quite small (W/L on the order of 0.5, for example), so that a low logic state driven by substrate bias detection circuit 1 can easily overcome the drive of transistor 39. As noted above, the inclusion of disable circuit 36, responsive to the signal on line VBB0_, is optional.

In operation, comparator 40 is enabled by line $V_{LA}$ being at a high logic level. With line $V_{LA}$ high, transistor 46 is turned on, and acts as a current source to ground. The sources of transistors 42 and 44 are pulled by transistor 46 to a voltage which is an n-channel threshold voltage ($V_{tn}$) below the voltage at lines $V_A$ and RVA, respectively. This allows transistors 42 and 44 to be conductive responsive to voltages applied to their respective gates, enabling the operation of comparator 40 to apply a voltage to node 34 which is based on the voltage on line $V_A$ from multiplier 21.

Also in normal operation, with sufficiently negative $V_{bb}$ bias at the substrate of the device, line VBB0_ is driven to a high logic level by substrate bias detection circuit 1. This ensures that transistor 38 is turned off, which disconnects disable circuit 36 from node 34. It should be noted that transistor 39 is always in an on-state with a positive $V_{dd}$, which ensures that the gate of transistor 38 remains at a high voltage even in the absence of a driven signal from substrate bias detection circuit 1 on line VBB0_.

As noted above, with main driver $22_A$ selected by line $V_{LA}$ at a high logic level, transistor 46 acts as a current source in comparator 40. Beginning with line RVA at a voltage below line $V_A$, transistor 42 will be more conductive than will transistor 44, due to the voltage on line $V_A$ being higher than the voltage on line RVA. Accordingly, the bulk of the current through current source transistor 46 will be drawn by transistors 49 and 42, rather than by transistors 48 and 44. In order to satisfy the transistor current-voltage relationships, the high current passing through transistor 49 relative to transistor 48 will cause the voltage at the drain of transistor 48 to rise toward $V_{dd}$, and will cause the voltage at the drain of transistor 49 to fall toward ground. With the drains of transistors 42 and 49 at node 34 falling, transistor 30 will become more conductive, pulling line RVA toward $V_{dd}$.

As line RVA is pulled toward $V_{dd}$, transistor 44 will tend to conduct more current. This will in turn draw more current through transistor 48 and less current through transistor 49, which in turn will cause the voltage at the drains of transistors 49 and 42 at node 34 to rise as the current therethrough is reduced. As node 34 rises, transistor 30 becomes less conductive, and the voltage at line RVA will fall via transistor 32.

As discussed above, it is preferable that transistors 42 and 44 be closely matched to one another, and that transistors 48 and 49 also be closely matched to one another. With adequate matching of these transistor pairs, the operation of comparator 40 will tend toward a point where the current passing through transistors 42 and 49 will match the current passing through transistors 44 and 48, with the gate-to-source voltages of transistors 48 and 49 becoming equal. Accordingly, comparator 40 will, in the steady-state, reach the operating condition where the voltage at line RVA equals the voltage at line $V_A$. Main driver $22_A$, when enabled by line $V_{LA}$, thus will drive array 25 according to the voltage on line $V_A$, which in this case is on the order of 3.3 volts.

In the event that main driver $22_A$ is to be disabled, such as during a standby operation, line $V_{LA}$ will be at a low logic level. This will turn off transistor 46, disabling the operation of comparator 40. Transistor 49 will pull node 34 to $V_{dd}$ with transistor 46 off, which will turn off transistor 30. Transistor 32 is also turned off by line $V_{LA}$ at a low logic level. With both transistors 30 and 32 turned off, main driver $22_A$ thus presents a high impedance to line RVA, allowing standby driver $24_A$ to drive line RVA and to bias array 25, without main driver $22_A$ loading line RVA.

With main driver $22_A$ of FIG. 3 enabled by line $V_{LA}$, at a high logic level, disable circuit 36 is operable to shut down the bias on line RVA. In the event that the voltage $V_{bb}$ at the substrate of the integrated circuit rises sufficiently toward the voltage of $V_{ss}$ that substrate bias detection circuit 1 switches, as described hereinabove, a low logic level will be presented thereby on line VBB0__. This will turn on transistor 38, causing the voltage $V_{dd}$ to be placed at node 34. This will turn off transistor 30, so that line RVA which is communicated to the remainder of the circuit (in this case array 25 of a memory device) cannot be driven to $V_{dd}$ by transistor 30. In this example, bias to periphery 27 of the memory device is also removed by the similar operation of drivers $22_P$ and $24_P$ in the event of loss of substrate bias.

Alternatively, it may be preferable to place the output of main driver $22_A$ in a high impedance condition when substrate bias is lost, rather than to pull it low via transistor 32 as described above. This may be accomplished by using the output of substrate bias detection circuit 1 to also gate the signal on line $V_{LA}$, so that line $V_{LA}$ is driven to a low logic level of adequate substrate bias. Such gating of line $V_{LA}$, as well as the use of the output of substrate bias detection circuit 1 to enable or disable other signals in the integrated circuit, will be apparent to one of ordinary skill in the art from this description.

Accordingly, the remainder of the circuit can be disabled in the event that a low logic level signal is received on line VBB0__. Without positive bias to those portions of the circuit biased by drivers 22 and 24, those portions of the circuit cannot enter the latch-up condition even with zero substrate bias. In this way, the loss of substrate bias is communicated by substrate bias detection circuit 1 to the remainder of the circuit, disabling the circuit so that a latchup condition cannot occur with the substrate bias lost.

Figure 1:
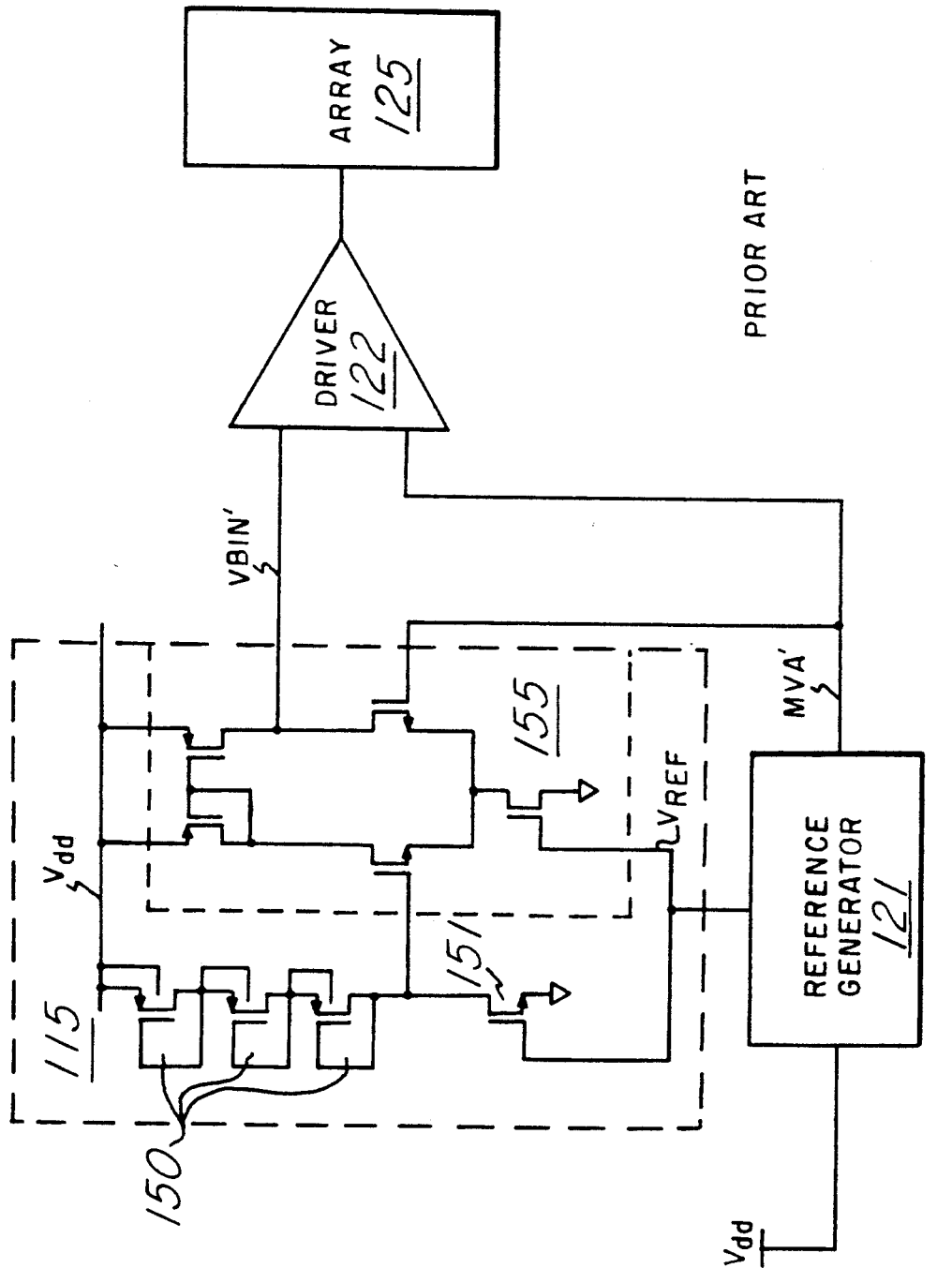
FIG. 1 is an electrical diagram, in block form, of a power supply distribution system according to the prior art.
Figures 4, 5:
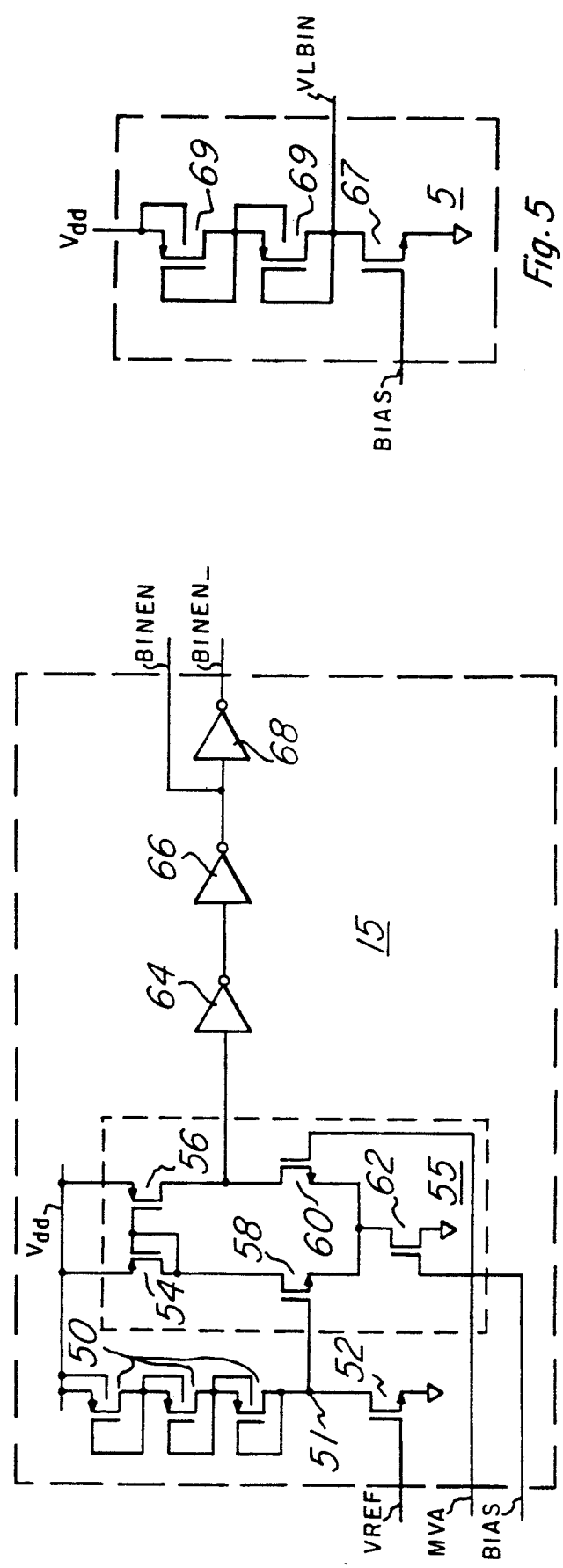
FIG. 4 is an electrical diagram, in schematic form, of an embodiment of a burn-in voltage detection circuit in the system of FIG. 2.
FIG. 5 is an electrical diagram, in schematic form, of an embodiment of a burn-in voltage generation circuit in the system of FIG. 2.

Referring now to FIG. 4, the construction and operation of burn-in voltage detection circuit 15 will be described in detail. The function of burn-in voltage detection circuit 15 is to compare the external power supply voltage $V_{dd}$ against a reference voltage, and to generate output signals on lines BINEN and BINEN__ to control voltage multiplexers 11 and 13. In this embodiment, the burn-in voltage VLBIN is to be selected for application to array 25 and periphery 27 when power supply voltage $V_{dd}$ is approximately 3.5 volts above the voltage of line MVA (which, in this case, is approximately at 3.3 volts). It should be noted that burn-in voltage detection circuit 15 is constructed similarly as burn-in voltage generator circuit 115 in the prior art system of FIG. 1.

In detection circuit 15, a chain of series-connected p-channel transistors 50 are connected between $V_{dd}$ and the drain of an n-channel pull-down transistor 52. The top transistor 50 in the chain has its source connected to $V_{dd}$, and the bottom transistor 50 in the chain has its drain connected to the drain of n-channel transistor 52, at node 51. Each transistor 50 in the chain has its gate connected to its drain, so as to be in its saturation region of operation, and has its substrate node connected to its source. The number of transistors 50 in the series-connected chain is determined by the $V_{dd}$ voltage, relative to the voltage on line MVA, at which the BINEN signal is to be generated. In this example, three transistors 50 are in the chain, so that the BINEN signal is generated when power supply voltage $V_{dd}$ exceeds the voltage on line MVA by three times the threshold voltage $V_{tp}$ of transistors 50. The threshold voltage $V_{tp}$ of each transistor 50 in this example is on the order of 1.0 volt.

Pull-down n-channel transistor has its source biased to ground, and has its gate biased by a reference voltage on line VREF. As noted above, line VREF carries a voltage generated by bandgap reference circuit 20, which in this case is on the order of 1.1 volts. In addition, transistor 52 is relatively small, with a W/L ratio on the order of 0.04, while the W/L ratio of each of transistors 50 is on the order of 2.0. Transistor 52 thus provides a pull-down load at node 51, ensuring a proper potential thereat.

Node 51 is connected to the gate of n-channel transistor 58 in comparator 55. Comparator 55, similarly as comparator 40 described hereinabove, includes in this embodiment an n-channel differential amplifier formed by transistors 58 and 60, together with a p-channel active current mirror load formed by transistors 54 and 56. N-channel transistor 62 acts as a current source in comparator 55, and has its drain connected to the sources of transistors 58 and 60, has its source connected to ground, and has its gate biased by line BIAS. Line BIAS presents a voltage to transistor 62 which is determined in such a manner that the current drawn by comparator 55 is sufficient for its operation, but which is not excessive, thus reducing the power consumption of detection circuit 15. The voltage of line BIAS is preferably lower than the voltage on line VREF (and thus can be generated therefrom by way of a voltage divider or the like), but above the threshold voltage of transistor 62.

P-channel transistors 54 and 56 each have their sources biased by power supply voltage $V_{dd}$, and have their gates tied together and to the drain of transistor 54, which is connected to the drain of transistor 58. The drain of transistor 56 is connected to the drain of transistor 60, and to the input of inverter 64. The gate of transistor 60 is connected to line MVA, so that comparator 55 is operable to compare the voltage on line MVA to the voltage at node 51. Inverter 64 has its output connected to the input of inverter 66, which generates a signal on line BINEN at its output; the input of another inverter 68 is connected to the output of inverter 66, and the output of inverter 68 presents a signal on line BINEN_ at its output.

In operation, comparator 55 compares the voltage at node 51, which is power supply voltage $V_{dd}$ less three $V_{tp}$, against the voltage on line MVA, which in this example is approximately 3.3 volts. With the voltage ($V_{dd}-3V_{tp}$) below the voltage on line MVA, the gate-to-source voltage of transistor 58 will be lower than the gate-to-source voltage of transistor 60. With transistor 62 acting as a current source, the bulk of the current in the two legs of comparator 55 will be drawn by transistors 56 and 60, rather than by transistors 54 and 58. This will cause a low level to be presented at the input of inverter 64, which in turn will generate a low level on line BINEN at the output of inverter 66, and a high level on line BINEN_ at the output of inverter 68. This state of lines BINEN and BINEN_ indicates that the externally applied power supply voltage $V_{dd}$ is below the level at which the burn-in voltage VLBIN (see FIG. 2) is to be applied to array 25 and periphery 27.

It should be noted that the output of comparator 55, connected to the input of inverter 64, will not swing fully between $V_{dd}$ and ground responsive to the relative levels of $V_{dd}$ (less $3V_{tp}$) and line MVA. Accordingly, it is preferable that inverter 64 be constructed as a CMOS inverter, with the n-channel pull-down transistor significantly larger than the p-channel pull-up transistor (W/L ratios on the order of 15 and 4, respectively). This will allow the output of inverter 64 to more quickly make a high-to-low transition than it makes a low-to-high transition, and with a trip point at the proper level so that lines BINEN and BINEN_ respond quickly to the application of a stress voltage at $V_{dd}$.

In the event that power supply voltage $V_{dd}$ rises to sufficient potential so that the quantity ($V_{dd}-3V_{tp}$) at node 51 exceeds the voltage on line MVA, transistor 58 in comparator 55 will conduct more than will transistor 60. Due to the action of the current mirror active load of transistors 54 and 56, the drains of transistors 56 and 60 will be driven toward $V_{dd}$. This will present a high logic level to the input of inverter 64, which in turn will generate a high logic level on line BINEN at the output of inverter 66 and a low logic level on line BINEN_ at the output of inverter 68. As will be described in further detail hereinbelow, these states on lines BINEN and BINEN_ will cause the voltage VLBIN to be applied to array 25 and periphery 27 of the memory device, in this embodiment.

Referring now to FIG. 5, the construction and operation of burn-in voltage generator circuit 5 will be described in detail. Burn-in voltage generator circuit 5 generates, on line VLBIN, a voltage based upon the externally applied power supply voltage $V_{dd}$. In this embodiment, burn-in voltage generator circuit includes n-channel transistor 67 which has its source biased to ground, has its drain connected to line VLBIN, and has its gate biased by line BIAS. Line BIAS, as in burn-in voltage detection circuit 15, is a relatively low voltage which biases transistor 67 to act as a current source. Transistor 67 is preferably a relatively small transistor, having a W/L ratio on the order of 0.03, so that the DC current drawn by burn-in voltage generator circuit 5 is minimized.

Burn-in voltage generator circuit 5 also includes two p-channel transistors 69 which have their source-to-drain paths connected in series between line VLBIN and $V_{dd}$. Each of transistors 69 has its gate connected to its drain, and its substrate node connected to its source. Accordingly, similarly as in burn-in voltage detection circuit 15, the voltage at line VLBIN will be at approximately $V_{dd}$ less, in this embodiment, two p-channel threshold voltages $V_{tp}$. In this example, since $V_{tp}$ is on the order of 1.0 volts, the voltage on line VLBIN is approximately two volts below $V_{dd}$. Of course, more or fewer transistors 69 may be used in the series chain of burn-in voltage generator circuit 5, depending upon the desired difference between $V_{dd}$ and the burn-in voltage on line VLBIN, and upon the threshold voltage of transistors 69.

Referring now to FIG. 6, the construction of high $V_{dd}$ detection circuit 9 according to the preferred embodiment of the invention will be described in detail. High $V_{dd}$ detection circuit 9 is described in detail in my copending application Ser. No. 453,550 filed Dec. 20, 1989, assigned to Texas Instruments Incorporated and incorporated herein by this reference. High $V_{dd}$ detection circuit 9 is biased by externally applied power supply voltage $V_{dd}$, and will generate a signal on line CLMPEN responsive to $V_{dd}$ exceeding a particular value, as will be described in further detail hereinbelow.

$V_{dd}$ biases the source and substrate node of a p-channel transistor 70. P-channel transistor 70 has its gate tied to its drain. A series of p-channel transistors 72, 74, and 76 are connected in series with p-channel transistor 70, all similarly configured (i.e., each with its substrate node tied to its source, and its gate tied to its drain). P-channel transistors 70, 72, 74, and 76 thus form a series of transistors operating in the saturation region, and having current-voltage characteristics similar to that of a diode, with a voltage drop thereacross approximately at the threshold voltage of the transistor ($V_{tp}$). Accordingly, the connection of transistors 70, 72, 74 and 76 in FIG. 6 is commonly referred to as the diode configuration for MOS transistors. The source of the top transistor 70 is connected to terminal $V_{dd}$, and its drain is connected to the source of transistor 72. The other transistors 74 and 76 are similarly connected drain-to-source in series, with the drain and gate of transistor 76 at node 78. The W/L ratios of transistors 70, 72, 74 and 76 are preferably the same, and are preferably quite large, for example at a value on the order of 100. Transistors 70, 72, 74 and 76 thus cause the voltage at node 78 to have a value which is approximately the voltage at V$_{dd}$ less, in this example, the sum of the threshold voltages transistors 70, 72, 74 and 76.

It will of course be apparent that more or fewer transistors than the four transistors 70, 72, 74 and 76 may be used to form the series of load devices, with the number of load devices depending upon the voltage values, relative to the voltage on line MVP, at which transitions of the output of the circuit are desired. In addition, it should be noted that other types of load devices, for example simple p-n junction diodes, may alternatively be used in place of transistors 70, 72, 74 and 76 configured as diodes The choice of diode type will, of course, depend upon ease of fabrication and other factors.

Node 78 is connected to the source of a p-channel drive transistor 80. The gate of transistor 78 is connected to line MVP, and the drain of drive transistor 78 is connected to the gates of transistors 82$p$ and 82$n$, which form a CMOS inverter. The source of p-channel transistor 82$p$ is connected to line MVP, the source of n-channel transistor is connected to ground, and the drains of transistors 82$n$ and 82$p$ are connected together in the conventional manner for a CMOS inverter. The relative sizes of transistors 82$n$ and 82$p$ may be set to have the desired switching characteristic for the particular circuit application, for example with the width-to-length ratio of transistor 82$p$ twice that of transistor 82$n$, due to the difference in mobility between p-channel and n-channel transistors. However, it should be noted that the relative sizes of transistors 82$n$ and 82$p$ are not of particular importance in practicing the instant invention.

The drains of transistors 82$n$ and 82$p$ are connected to the input of CMOS inverter 84. CMOS inverter 84 is similarly constructed as the inverter formed by transistors 82$p$ and 82$n$, and is preferably biased by line RVP. The output of inverter 84 is connected to the gates of transistors 86$p$ and 86$n$, which form another CMOS inverter.

In the inverter formed by transistors 86$p$ and 86$n$, the source of transistor 86$p$ is biased by V$_{dd}$, the source of transistor 86$n$ is connected to ground, and the drains of transistors 86$p$ and 86$n$ are connected together. It is preferable, in this embodiment, that the W/L ratio of transistor 86$n$ be much larger than that of transistor 86$p$. For example, transistor 86$n$ may have a W/L of about 15, while the W/L ratio of transistor 86$p$ may be on the order of 4. This relationship between the sizes of transistors 86$n$ and 86$p$ is preferred so that the output node at the drains of transistors 86$n$ and 86$p$ will make a high-to-low transition much faster than it will make a low-to-high transition. This provides a fast response to the V$_{dd}$ power supply voltage exceeding the positive-going trip point, and also provides additional stability by slowing the response of the circuit for the negative-going transition.

The drains of transistors 86$n$ and 86$p$ are connected to the input of an inverter 88, which also is biased by V$_{dd}$. The output of inverter 88 is connected, in turn, to the input of inverter 90, which is also biased by V$_{dd}$. The output of inverter 90 is connected to line CLMPEN_; the output of inverter 88 drives line CLMPEN, which of course is the logical complement of line CLMPEN_ due to the operation of inverter 90. In this embodiment, a low logic level signal is desired on line CLMPEN_ responsive to V$_{dd}$ exceeding a defined value greater than the voltage on line RVP, as will be described hereinbelow.

According to this embodiment of the invention, p-channel transistor 92 provides feedback to the series chain of transistors 70, 72, 74 and 76. The source and substrate node of transistor 92 is connected to the source of one of the transistors in the chain, in this case transistor 74. The drain of transistor 92 is connected to the source of another transistor in the chain, in this case the source of transistor 76. The gate of transistor 92 is connected to a point in the output buffer chain in such a manner that transistor 92 is conductive responsive to V$_{dd}$ being above the desired threshold. In this example, the gate of transistor 92 is connected to the drains of transistors 86$p$ and 86$n$.

The purpose of transistor 92 is to change the electrical length of the series chain of transistors 70, 72, 74 and 76, responsive to power supply voltage V$_{dd}$. In the example of FIG. 6, when transistor 92 is conductive, transistor 74 is shorted out by transistor 92, so that only three transistors are electrically in series between V$_{dd}$ and node 18, instead of all four transistors 70, 72, 74 and 76 which are electrically in series when transistor 92 is off. Of course, the source-to-drain path of feedback transistor 92 can alternatively be connected across a different one of transistors 70, 72, 74 and 76 to achieve the same hysteresis effect as will be described hereinbelow. In addition, feedback transistor 92 may be connected across more than one transistor 70, 72, 74 and 76 in the chain, if the hysteresis loop in the transfer characteristic is desired to be wider.

The source/drain path of n-channel transistor 81 is connected between the drain of transistor 80 and ground. The gate of transistor 81 is controlled by line MVP. Transistor 81 ensures that the node at the gates of transistors 82$p$ and 82$n$ is fully discharged when V$_{dd}$ is below the detection value. In this embodiment, when V$_{dd}$ is below the trip point, transistor 80 will remain in the off condition and transistor 81 will be conductive, so that the logic state at the gates of transistors 82$n$ and 82$p$ is at a defined low level. Since transistor 81 remains on even when transistor 80 is on (i.e., when an overvoltage condition is detected), due to its gate being at the voltage of line MVP, the W/L ratio of transistor 81 is preferably much smaller than the W/L ratio of transistor 80. In the preferred embodiment, the W/L ratio of transistor 80 is on the order of 100, while the W/L ratio of transistor 81 is on the order of 0.05. This small W/L ratio for transistor 81 thus minimizes the DC current drawn from V$_{dd}$ through transistors 70, 72, 74, 76, 80 and 82 to ground.

In operation, transistor 80 will remain in the off state until the voltage at its drain, i.e., at node 78, exceeds the voltage on line MVP by its threshold voltage. In this example with transistor 80 enhancement mode, the absolute value of its threshold voltage will be hereinafter referred to as V$_{t80}$; of course, a depletion mode device may alternatively be used for transistor 80, with the appropriate change in the behavior of the circuit. However, since there are four transistors 70, 72, 74 and 76 in series between V$_{dd}$ and node 78, the voltage at node 78 is at a value approximately of V$_{dd}$ less the threshold voltages of the transistors in the series chain, which in this case is 4V$_{tp}$. Therefore, transistor 80 does not turn on until V$_{dd}$ reaches the value:

$$MVP + 4V_{tp} + V_{t80}$$

In this embodiment, with line MVP approximately at 4.0 volts (relatively independently of the voltage of $V_{dd}$), and with $V_{t80}$ and $V_{tp}$ each on the order of 1.0 volts, transistor 80 will turn on responsive to power supply voltage $V_{dd}$ rising above approximately 9.0 volts.

With transistor 80 off, which is the case with $V_{dd}$ below the trip point, transistor 81 pulls the voltage at the gates of transistors 82n and 82p to ground. This places the voltage of line RVP, biasing the source of transistor 82p, at the input to inverter 84. The output of inverter 84 is thus driven to ground, which turns on transistor 86p and turns off transistor 86n. Power supply voltage $V_{dd}$ is thus presented to the gate of transistor 92, keeping it off. The high logic level at the input of inverter 88 also causes line CLMPEN_ to be at a high logic level and line CLMPEN to be at a low logic level, indicating that $V_{dd}$ is below the trip point and, as will be described hereinbelow, that the voltage VCLMP is not to be applied to array 25 and periphery 27.

When $V_{dd}$ reaches the value $MVP+4V_{tp}+V_{t80}$, the voltage at node 78 (the source of transistor 80) is sufficiently high that transistor 80 turns on. This causes the voltage at the gates of transistors 82p and 82n to be at the value $MVP+4V_{tp}+V_{t80}$ which, in this preferred embodiment, is above the threshold voltage of transistor 82n so that the drains of transistors 82n and 82p are pulled to ground potential through transistor 82n. This causes the output of inverter 84 to go to the level of line RVP, which also is above the threshold voltage of transistor 86n, making transistor 86n conductive and transistor 86p substantially non-conductive.

Upon transistor 86n turning on, the input of inverter 88 is pulled low so that, via inverters 88 and 90, line CLMPEN will go to a high logic level and line CLMPEN_ will go to a low logic level, indicating that $V_{dd}$ has reached a level over $MVP+4V_{tp}+V_{t80}$. Referring to FIG. 2, this will cause multiplexers 11 and 13 to apply the clamped bias voltage $V_{CLMP}$ to array 25 and periphery 27, respectively.

In addition, once transistor 86n has been turned on by the output of inverter 84, the gate of transistor 92 is pulled toward ground. This turns p-channel transistor 92 on, so that the source and drain of transistor 74 in the series diode chain are shorted together through transistor 92. This reduces the level of $V_{dd}$ at which transistor 78 will remain on, by the threshold voltage of the transistors shorted out by transistor 92. In this case, since one transistor 74 is shorted out by transistor 92, the voltage at which terminal $V_{dd}$ can remain to keep transistor 80 on, and in turn to keep the voltage on lines CLMPEN and CLMPEN_ in the state at which they indicate an overvoltage condition on line $V_{dd}$, is reduced to:

$$MVP+3V_{tp}+V_{t80}$$

Therefore, as $V_{dd}$ drops from the value $MVP+4V_{tp}+V_{t80}$, the voltage on line CLMPEN_ will remain low until $V_{dd}$ drops to the value $MVP+3V_{tp}+V_{t80}$ which, in this embodiment, is on the order of 8.0 volts. At this point, the logic states of lines CLMPEN and CLMPEN_ will return to their originally low and high logic levels, respectively.

Figure 7:
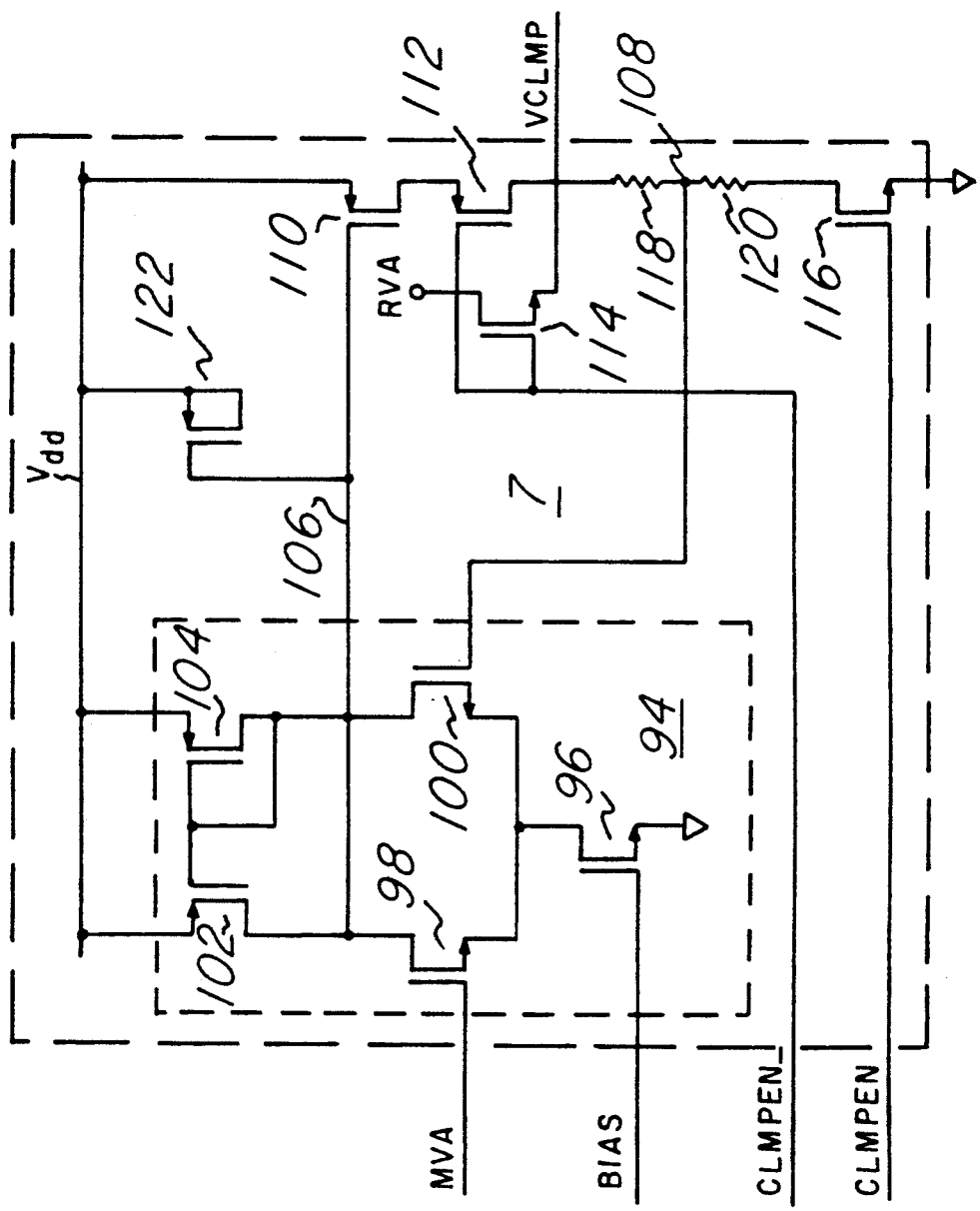
FIG. 7 is an electrical diagram, in schematic form, of an embodiment of the power supply clamp circuit in the system of FIG. 2.

Referring now to FIG. 7, $V_{dd}$ clamp circuit 7 will be described in detail. $V_{dd}$ clamp circuit 7 drives at its output, on line VCLMP, a voltage which is derived from external power supply voltage $V_{dd}$ but which is clamped at a maximum voltage by the operation of comparator 94 in $V_{dd}$ clamp circuit 7. When enabled by lines CLMPEN and CLMPEN_ generated by high $V_{dd}$ detection circuit 9 described hereinabove, $V_{dd}$ clamp circuit 7 will present a clamped power supply voltage on line VCLMP to array 25 and periphery 27, so that excessively high voltages presented externally by the $V_{dd}$ power supply do not damage the remainder of the circuit.

Comparator 94 is an n-channel differential amplifier with a p-channel current mirror active load, similar to the comparators described hereinabove. N-channel transistor 96 serves as a current source in comparator 94, and has its drain connected to the sources of n-channel transistors 98 and 100 which serve as the differential amplifier; the source of transistor 94 is connected to ground and its gate is biased by the voltage on line BIAS, similarly as the other comparators described hereinabove. As in the other comparators, the W/L ratios of transistors 98 and 100 are preferably well-matched, at a value, for example, on the order of 15.

The gate of n-channel transistor 98 is connected to line MVA, which is the regulated voltage generated by multiplier 21 as described hereinabove; in this example, the voltage on line RVA is on the order of 3.3 volts. The drain of transistor 98 is connected, at node 106, to the drain of p-channel transistor 102 in the current mirror active load. Node 104 is connected to the gate of p-channel pull-up transistor 110. The gate of n-channel transistor 100 is connected to node 108, for receiving a feedback voltage from line VCLMP as will be described hereinbelow. P-channel transistor 104 has its drain connected to the drain of transistor 100. The gates of transistors 102 and 104 are connected together, and to the drain of transistor 104, and the sources of transistors 102 and 104 are biased by $V_{dd}$.

The drive portion of $V_{dd}$ clamp circuit 7 includes pull-up p-channel transistor 110 which has its source connected to $V_{dd}$ and has its drain coupled to line VCLMP, in this embodiment via transistors 112. The gate of transistor 110 is connected to node 106, and is thus controlled by comparator 94 as noted above. Resistors 118 and 120 are connected in series between line VCLMP and ground, with transistor 120 also connected in series therewith as described hereinbelow. The values of resistors 108 and 120 are used to set the voltage to be driven by high $V_{dd}$ on line VCLMP. Node 108, at the electrical connection between resistors 118 and 120, is connected to the gate of transistor 100 in comparator 94. Accordingly, the voltage at node 108 will be compared against the voltage on line MVA, so that the voltage on line VCLMP will be determined by the voltage divider network of resistors 118 and 120, as will be described hereinbelow.

Capacitor 122 is connected between node 106 and $V_{dd}$ to provide compensation for the differential amplifier of comparator 94 in $V_{dd}$ clamp circuit 7. Capacitor 122 is preferably a p-channel MOS capacitor, having a size of 250 microns by 200 microns, and having a dielectric of silicon dioxide having a thickness on the order of 15 nm, thus providing a capacitance on the order of 100 pF. Compensation capacitor 122 thus adds stability to the operation of $V_{dd}$ clamp circuit 7. Of course, other compensation techniques, or no compensation whatsoever, may alternatively be used depending upon the specifics of the construction of $V_{dd}$ clamp circuit 7.

$V_{dd}$ clamp circuit 7 further includes enabling transistors 112, 114, and 116 which are controlled by high $V_{dd}$ detection circuit 9 via lines CLMPEN and CLMPEN_. P-channel transistor 112 has its source/drain path connected between line VCLMP and $V_{dd}$, in series with pull-up transistor 110, and has its gate controlled by line CLMPEN_. N-channel transistor 114 also has its gate controlled by line CLMPEN_, and has its source/drain path connected directly between line RVA, from the output of drivers 22$_a$ and 24$_a$, and line VCLMP. N-channel transistor 116 has its source/drain path connected between line VCLMP and ground, in series with resistors 118 and 120, and has its gate controlled by line CLMPEN.

Transistors 112, 114 and 116 allow the state of lines CLMPEN and CLMPEN_ to enable comparator 94 to control line VCLMP only when high $V_{dd}$ detection circuit 9 has detected an overvoltage condition on $V_{dd}$. For example, when lines CLMPEN_ and CLMPEN are at high and low logic levels, respectively (as is the case during normal operation when $V_{dd}$ is not in an overvoltage condition), transistors 112 and 116 will be off, and transistor 114 will be on. In this way, the DC current path between $V_{dd}$ and ground through transistor 110 and resistors 118 and 120 is disabled, minimizing the power dissipation of $V_{dd}$ clamp circuit 7 accordingly. In addition, transistor 114 serves to bias line VCLMP from RVA during normal operation, so that in the event that an overvoltage condition is detected on $V_{dd}$ (in which case lines CLMPEN_ and CLMPEN are driven low and high, respectively), $V_{dd}$ clamp circuit 7 will not need to charge up line VCLMP from ground to the clamped voltage, as line VCLMP will already be at the burn-in voltage generated on line VLBIN and applied to array 25 on line RVA by multiplexer 11 and driver 22$_A$. Accordingly, noise which would otherwise be generated from $V_{dd}$ clamp circuit fully charging line VCLMP from ground to the clamped voltage is much reduced.

When high $V_{dd}$ clamp circuit 7 is enabled by high $V_{dd}$ detection circuit 9, responsive to the power supply voltage $V_{dd}$ exceeding the trip point (in this example, responsive to $V_{dd}$ exceeding 9.0 volts), low and high logic levels on lines CLMPEN_ and CLMPEN, respectively, will turn on transistors 112 and 116 and turn off transistor 114. Comparator 94 will compare the voltage at node 108 to the voltage on line MVA. Due to the gates of transistors 102 and 104 being connected together and to the drains of transistors 100 and 104, node 106 will be driven to a lower voltage responsive to the voltage on line MVA being higher than the voltage at node 108. As node 106 drops in voltage, transistor 110 will become more conductive, and will charge line VCLMP from $V_{dd}$. Conversely, when the voltage at node 108 exceeds the voltage on line MVA, comparator 94 will raise the voltage at node 106 toward $V_{dd}$, which will cause transistor 110 to become less conductive, and will allow resistors 118 and 120 to pull line VCLMP toward ground through transistor 116.

As noted above, transistors 98 and 100 are preferably well matched with one another, as are transistors 102 and 104. With this being the case, the operation of comparator 94 will cause $V_{dd}$ clamp circuit 7 to reach a steady state at which the voltage at node 108 will equal the voltage on line MVA. With the voltage at node 108 equal to the voltage on line MVA, the voltage on line VCLMP will depend upon the values of resistors 118 and 120. In this embodiment, the value of resistor 118 is on the order of 5.0 kOhm, and the value of resistor 120 is on the order of 4.5 kOhm. With these values for resistors 118 and 120, the voltage which is generated on line VCLMP responsive to 3.3 volts at node 108 is approximately 7.0 volts.

Figure 8:
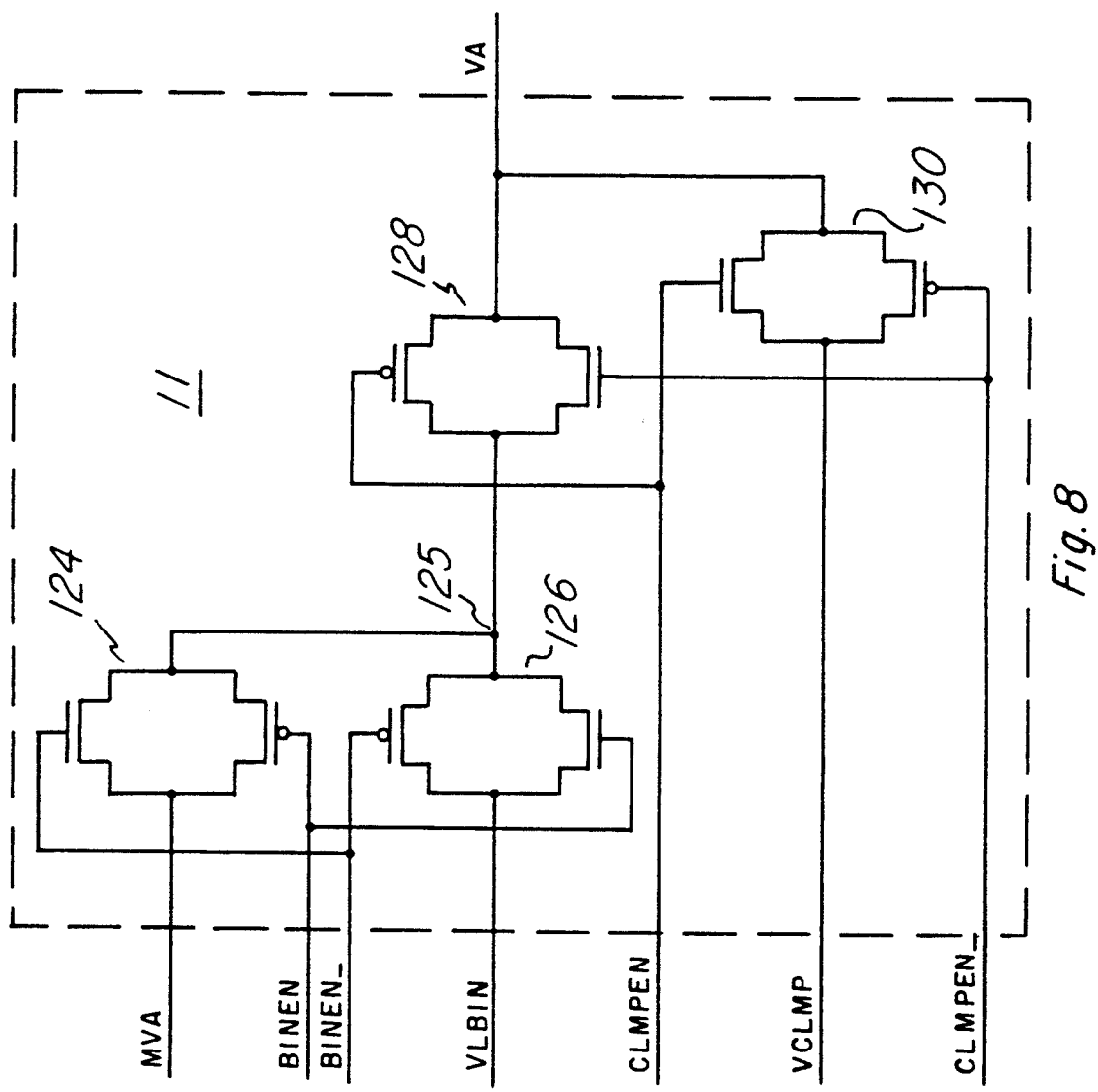
FIG. 8 is an electrical diagram, in schematic form, of an embodiment of a multiplexer in the system of FIG. 2.

Referring now to FIG. 8, the construction and operation of $V_{array}$ multiplexer 11 will be described in detail. It should be noted that $V_{peri}$ multiplexer 13 is preferably constructed identically as $V_{array}$ multiplexer 11, except of course that line MVP rather than MVA is input thereto, and that its output is connected to line VP rather than VA. $V_{array}$ multiplexer 11 receives, at its power inputs, line MVA from multiplier circuit 21, line VLBIN from burn-in voltage generator circuit 5, and line VCLMP from $V_{dd}$ clamp circuit 7. $V_{array}$ multiplexer 11 selects received on lines BINEN and BINEN_ from burn-in voltage detection circuit 15 and on lines CLMPEN and CLMPEN_ from high $V_{dd}$ detection circuit 9. Included within $V_{array}$ multiplexer 11 are pass gates 124, 126, 128, and 130, each of which consist of an n-channel MOS transistor in parallel with a p-channel MOS transistor. The control inputs on lines BINEN, BINEN_, CLMPEN and CLMPEN_ are connected to the gates of the transistors of the appropriate ones of pass gates 124, 126, 128 and 130 in such a manner that the signal communicated to the gate of the n-channel transistor in each of pass gates 124, 126, 128 and 130 is the logical complement of the signal communicated to the gate of the p-channel transistor therewithin.

Line MVA is connected to the input of pass gate 124, which is controlled by lines BINEN and BINEN_. Similarly, line VLBIN is connected to the input of pass gate 126, which is also controlled by lines BINEN and BINEN_, but in a fashion complementary to that of pass gate 124. Accordingly, with high and low logic levels on lines BINEN and BINEN_, respectively, line VLBIN will be connected by pass gate 126 to node 125, and line MVA will be isolated by pass gate 124 from node 125. Conversely, with low and high logic levels on lines BINEN and BINEN_, respectively, line MVA will be connected by pass gate 124 to node 125, and line VLBIN will be isolated by pass gate 126 from node 125. Since burn-in voltage detection circuit 15 issues high and low logic levels on lines BINEN and BINEN_, respectively, in response to power supply voltage $V_{dd}$ exceeding the voltage level at which burn-in is to take place, line MVA is connected to node 125 during normal operation and line VLBIN is connected to node 125 when the high $V_{dd}$ level indicates that an accelerated voltage burn-in operation is to be performed.

Node 125 is connected to the input of pass gate 128, which is controlled by lines CLMPEN and CLMPEN_. Line VCLMP is connected to the input of pass gate 130, which is also controlled by lines CLMPEN and CLMPEN_ but in a fashion complementary to the control of pass gate 128. With low and high logic levels on lines CLMPEN and CLMPEN_, respectively, node 125 will be connected by pass gate 128 to line VA, and line VCLMP will be isolated by pass gate 130 from line VA. Conversely, with high and low logic levels on lines CLMPEN and CLMPEN_, respectively, line VCLMP will be connected by pass gate 130 to line VA, and node 125 will be isolated by pass gate 128 from line VA. Accordingly, high $V_{dd}$ detection circuit 9, by issuing high and low logic levels on lines CLMPEN and CLMPEN_ responsive to power supply voltage $V_{dd}$ exceeding the voltage at which the bias to array 25 and periphery 27 is to be clamped, can override the selection of the regulated voltage (line RVA) or burn-in voltage (line VLBIN) to line VA, so that the clamped voltage on line VCLMP can be applied thereto. As noted above, line VA is input to drivers 22$_A$ and 24$_A$, and line VP is input to drivers 22$_P$ and 24$_P$, for application of the voltages thereupon to array 25 and periphery 27, respectively.

Figure 9:
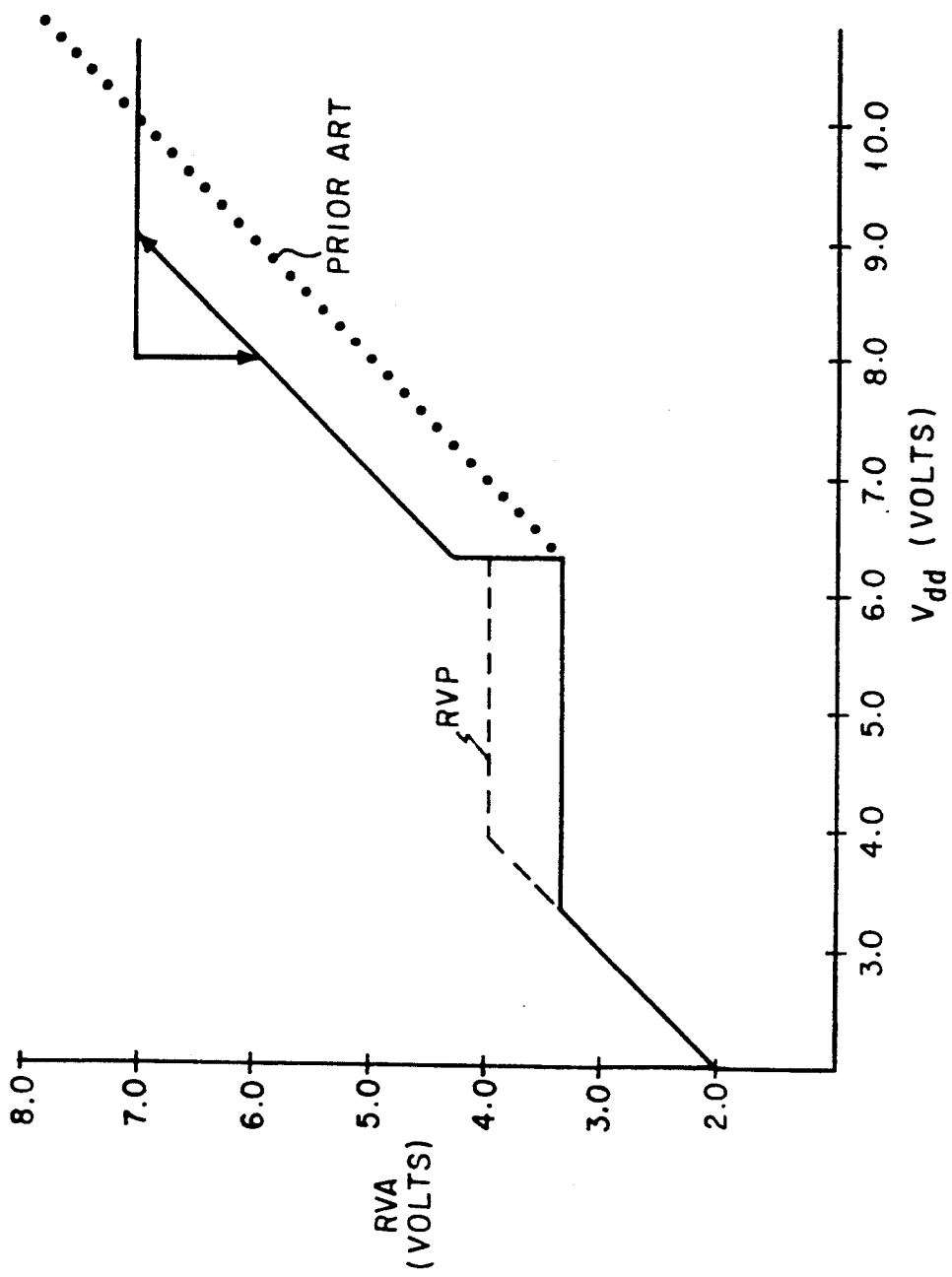
FIG. 9 is a DC transfer characteristic comparing the operation of the systems of FIGS. 1 and 2 as a function of the external applied power supply voltage.

Referring now to FIG. 9, the operation of the system of FIG. 2 in providing a bias voltage on line RVA to array 25 as a function of the externally applied power supply voltage V$_{dd}$ will be described. For purposes of this example, the nominal level of power supply voltage V$_{dd}$ which is applied to the memory device during normal memory operation is on the order of 5.0 volts. As described above, during this normal operation, the voltage on line RVA which is to bias array 25 is on the order of 3.3 volts, so that the power dissipation of array 25, as well as the breakdown rate of the storage capacitor dielectric in the memory cells of array 25, are both minimized. So that the switching speed of transistors in periphery 27 is maximized, the nominal operating voltage on line RVP is, in this example, on the order of 4.0 volts.

This description of the operation of the system of FIG. 2 will begin with the external power supply voltage V$_{dd}$ increasing from ground potential. As the external power supply voltage V$_{dd}$ is powered up toward its nominal operating level of 5.0 volts, regulated voltage drive circuit 3 will provide a voltage of 3.3 volts on line RVA and a voltage of 4.0 volts on line RVP, as described hereinabove. Since power supply voltage V$_{dd}$ is below the trip point of burn-in voltage detection circuit 15, which in this example is approximately 6.4 volts, lines BINEN and BINEN_ (and, of course, lines CLMPEN and CLMPEN_) will have low and high logic levels, respectively, thereupon. V$_{array}$ multiplexer 11 and V$_{peri}$ multiplexer 13 will select the voltages on lines MVA and MVP, respectively, for application to lines RVA and RVP, respectively. Array 25 will thus be biased, in this example, by a voltage on the order of 3.3 volts, and periphery 27 will be biased by a voltage on the order of 4.0 volts.

As power supply voltage V$_{dd}$ exceeds the trip point of burn-in voltage detection circuit 15 at 6.4 volts, in this example, high and low logic levels are driven on lines BINEN and BINEN_, as described hereinabove. This causes V$_{array}$ multiplexer 11 and V$_{peri}$ multiplexer 13 to select the voltage on line VLBIN to be applied to lines RVA and RVP, respectively. As discussed above, burn-in voltage generator circuit 5 generates a voltage on line VLBIN which varies with power supply voltage V$_{dd}$, so that an accelerated voltage may be applied to array 25 and periphery 27 for purposes of burn-in or for accelerated operating life testing.

It should be noted that an offset is present between the regulated voltages on line MVA (and line MVP) and the voltage on line VLBIN which is to be applied to the circuit during the stress or burn-in operation. As described above relative to FIG. 5, this offset is determined by the number of transistors 69 which are in series between V$_{dd}$ and line VLBIN in burn-in voltage generator circuit 5. The offset in burn-in voltage generator circuit 5 can, according to this embodiment of the invention, be set independently from the voltage at which the stress, or burn-in, operation is enabled by burn-in voltage detection circuit 15, as this voltage is determined by the number of transistors 50 in burn-in voltage detection circuit 15. The system of FIG. 2 thus allows the designer flexibility in the selection of the desired burn-in voltage (i.e., its offset from V$_{dd}$) independently from the voltage at which the burn-in voltage is to be applied to the circuit. In this way, for example, a high stress voltage may be applied to the circuit during burn-in without requiring an excessive external power supply voltage V$_{dd}$, as would be required in the system of FIG. 1 according to the prior art.

Upon power supply voltage V$_{dd}$ increasing to the point at which high V$_{dd}$ detection circuit 9 trips, which in this embodiment is at approximately 9.0 volts, high and low logic levels are driven by high V$_{dd}$ detection circuit 9 onto lines CLMPEN and CLMPEN_, respectively. Responsive thereto, V$_{array}$ multiplexer 11 and V$_{peri}$ multiplexer 13 select the voltage on line VCLMP from V$_{dd}$ clamp circuit 7 for application to lines RVA and RVP, respectively. By this operation, the system of FIG. 2 buffers excessively high V$_{dd}$ supply voltages from application directly to array 25 and periphery 27, thereby reducing the susceptibility of those portions of the integrated circuit to damage from electrical overstress.

As described hereinabove, high voltage detection circuit 9 includes hysteresis in its transfer characteristic, so that control of the application of the voltage of line VCLMP to array 25 and periphery 27 will not oscillate if power supply voltage V$_{dd}$ varies near the positive-going trip point of high voltage detection circuit 9. Accordingly, upon V$_{dd}$ falling from a level above approximately 9.0 volts to a level below 8.0 volts, in this embodiment, lines CLMPEN and CLMPEN_ will be driven by high V$_{dd}$ detection circuit 9 to low and high logic levels, accordingly. The voltage on line VLBIN will then again be applied to lines RVA and RVP, until power supply voltage V$_{dd}$ again falls into the normal operating range.

Of course, many variations of the system of FIG. 2 may be made while still obtaining the benefit of the invention. One such variation is, of course, to bias all portions of the integrated circuit (both array 25 and periphery 27 in a memory device, for example, or the entire VLSI circuit in other devices) with a single voltage. In such a circuit, only one multiplexer is of course required. Another variation would, of course, be to exclude the ramped burn-in voltage portion of the transfer characteristic, so that the circuit would go directly from the regulated (or, alternatively, unregulated) power supply bias to the clamped condition.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A memory device, comprising:
    an array of memory cells formed on a semiconductor substrate;
    periphery circuits formed on the semiconductor substrate, connected to the array of memory cells;
    a main driver formed on the semiconductor substrate, to provide voltage to the array of memory cells and to the periphery circuits when they are active;

a standby driver formed on the semiconductor substrate, to provide voltage to the array of memory cells and to the periphery circuits when they are inactive; and a voltage generator system formed on the semiconductor substrate to provide a plurality of different voltages that may power the main driver and the standby driver depending upon various operating conditions.

2. The memory device of claim 1 wherein the voltage generator system includes:

a burn-in voltage generator system to provide a burn-in voltage during burn-in operating condition;

a regulated voltage generator system to provide a regulated voltage during normal operating condition; and a multiplexer connected to the burn-in voltage generator system, the regulated voltage generator system, the main driver, and the standby driver to connect either the burn-in voltage or the regulated voltage to the main driver and the standby driver depending upon the operating condition.

3. The memory device of claim 2 wherein the voltage generator system receives power from a voltage source external to the semiconductor substrate and further includes:

a clamp voltage generator system to provide a clamped voltage during a stress operating condition occurring when the power from the external voltage source exceeds a predetermined value; and wherein the multiplexer is further connected to clamp voltage generator system to connect either the burn-in voltage or the regulated voltage or the clamped voltage to the main driver and the standby driver depending upon the operating condition.

4. The memory device of claim 3 further including:

a substrate bias voltage generator system formed on the semiconductor substrate to provide a substrate bias voltage to the array of memory cells and to the periphery circuits and connected to the main driver and the standby driver to disable the main driver and the standby driver so that the array of memory cells and the periphery circuits are powered down in the event of loss of the substrate bias voltage.

5. An on chip system to generate voltages for a device formed on a semiconductor chip, comprising:

a first generator to produce a regulated voltage;

a second generator to produce a burn-in voltage;

a third generator to produce a substrate bias voltage;

a multiplexer connected to the first and second generators to supply the regulated voltage or the burn-in voltage to the device; and wherein the first, second, and third generators and the multiplexer are formed on the semiconductor chip with the device.

6. The system of claim 5 wherein the regulated voltage has a value of about 3 volts and the substrate bias voltage has a value of about −2 volts.

7. The system of claim 6 further comprising:

a fourth generator to produce a clamped voltage, connected to the multiplexer; and wherein the burn-in voltage has a value of about 7 volts and the clamped voltage has a value of about 7 volts.

* * * * *